(12) United States Patent
Madraswala et al.

(10) Patent No.: US 12,230,334 B2
(45) Date of Patent: Feb. 18, 2025

(54) DYNAMIC PROGRAM CACHING

(71) Applicant: Intel NDTM US LLC, Santa Clara, CA (US)

(72) Inventors: Aliasgar S. Madraswala, Folsom, CA (US); Ali Khakifirooz, Brookline, MA (US); Bhaskar Venkataramaiah, Folsom, CA (US); Sagar Upadhyay, Folsom, CA (US); Yogesh B. Wakchaure, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 104 days.

(21) Appl. No.: 17/710,978

(22) Filed: Mar. 31, 2022

(65) Prior Publication Data

US 2023/0317182 A1 Oct. 5, 2023

(51) Int. Cl.
  *G11C 16/34* (2006.01)
  *G11C 16/10* (2006.01)
  *G11C 16/26* (2006.01)
  *G11C 16/32* (2006.01)

(52) U.S. Cl.
  CPC ........ *G11C 16/3459* (2013.01); *G11C 16/102* (2013.01); *G11C 16/26* (2013.01); *G11C 16/32* (2013.01); *G11C 16/3404* (2013.01)

(58) Field of Classification Search
  CPC .............. G11C 16/3459; G11C 16/102; G11C 16/26; G11C 16/32; G11C 16/3404; G11C 2211/5621; G11C 2211/5622; G11C 16/0483; G11C 11/5628

USPC .................................................... 365/185.17
See application file for complete search history.

(56) References Cited

U.S. PATENT DOCUMENTS

| | | | |
|---|---|---|---|
| 9,740,419 B2 | 8/2017 | Wakchaure et al. | |
| 2015/0081952 A1 | 3/2015 | d'Abreu et al. | |
| 2017/0177265 A1 | 6/2017 | Srinivasan et al. | |
| 2017/0371565 A1* | 12/2017 | Liu ........................ | G06F 3/064 |
| 2019/0164612 A1 | 5/2019 | Solanki et al. | |
| 2021/0035630 A1 | 2/2021 | Lee et al. | |
| 2022/0083463 A1 | 3/2022 | Muchherla et al. | |

OTHER PUBLICATIONS

International Search Report and Written Opinion for PCT Patent Application No. PCT/US23/10621, Mailed May 3, 2023, 11 pages.
(Continued)

*Primary Examiner* — Fernando Hidalgo
(74) *Attorney, Agent, or Firm* — Compass IP Law PC

(57) ABSTRACT

Dynamic program caching reduces latency of a program operation on multi-level cell (MLC) memory having at least three pages and programmable with multiple threshold voltage levels, such as a Triple Level Cell (TLC) NAND. A controller determines that the program operation can be initiated without loading all pages into the memory. In response, the NAND loads a first page and then executes portions of the program operation in parallel, at least in part, with loading subsequent pages. The NAND behavior is modified to monitor data loading completion times, to copy pages from a cache register to a data register as needed, and to resume program operation if a shutdown occurs. The portions of the program operation include a program prologue operation and a pulse verify loop for the first voltage level (L1) of the MLC memory.

21 Claims, 12 Drawing Sheets

(56) References Cited

OTHER PUBLICATIONS

Khakifirooz, et al., "A 1Tb 4b/Cell 144-Tier Floating-Gate 3D-NAND Flash Memory with 40MB/s Program Throughput and 13.8Gb/mm2 Bit Density", 2021 IEEE International Solid-State Circuits Conference (ISSCC), Feb. 13-22, 2021, 24 pages.

\* cited by examiner

DYNAMIC PROGRAM CACHING

FIELD

This disclosure relates to NAND memory and, more particularly, to program operations for multi-threshold level NAND memory.

BACKGROUND

NAND memory is a type of non-volatile memory that may be included in a solid state drive (SSD) or other types of storage devices to store data. Some NAND memories such as Single Level Cell (SLC) NAND memories store one bit of data per cell. Other NAND memories such as Multi-Level Cell (MLC) NAND memories store multiple bits of data per cell (e.g., two bits, three bits, etc.). MLC NAND memories that store three and four bits of data per cell are referred to respectively as Triple Level Cell (TLC) and Quad Level Cell (QLC) memories. Newer generations of MLC memories can store even more bits per cell, such as Penta Level Cell (PLC) memories that store five bits per cell. As used herein, the term MLC memory collectively refers to NAND memory, including TLC, QLC and PLC memories. The term NAND memory includes three-dimensional (3D) NAND memory.

Although MLC NAND memories enable greater data densities (e.g., multiple bits of data per cell), they take longer to program (e.g., have slower write speeds or longer write times) to write the same data relative to SLC memories. For example, SLC memories can be written approximately seven to eight times faster than TLC memories because writing one bit per cell requires less programming pulses to change electrical characteristics of an SLC memory cell to represent one bit as compared to writing multiple bits per cell which requires more programming pulses. For this reason, while the higher densities of MLC NAND memory offer significant cost savings in terms of the amount of data that can be stored, the time required to program pages of higher density NAND increases significantly as compared to lower density NAND because of the increase in the density of data programmed per cell.

BRIEF DESCRIPTION OF THE DRAWINGS

The described embodiments are illustrated by way of example and not limitation in the figures of the accompanying drawings, in which like references indicate similar elements and in which.

Figure 1:
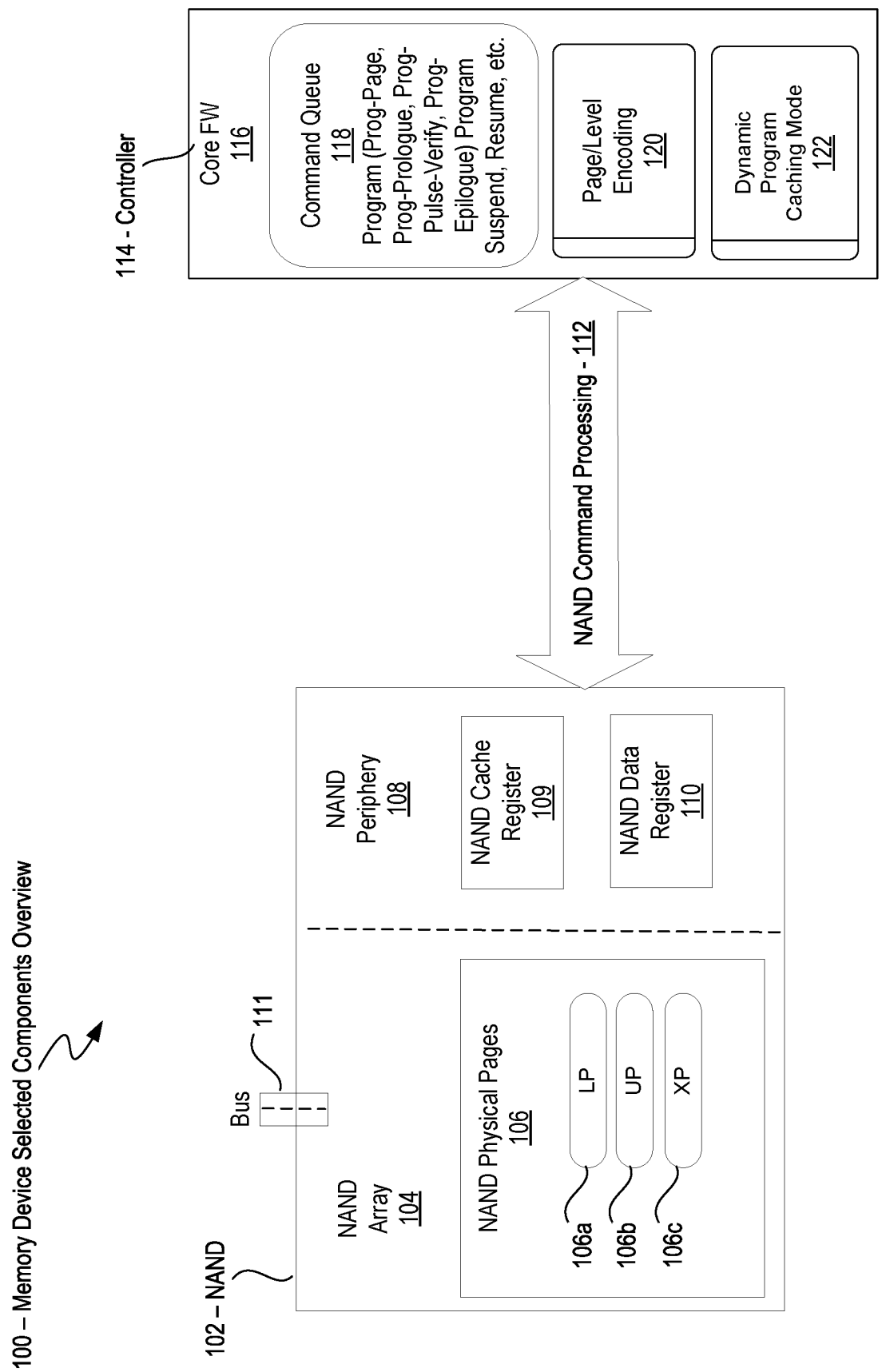
FIG. 1 is a block diagram of selected components of a memory device in which dynamic program caching reduces program latency and improves read/write performance for NAND memory in accordance with various examples described herein.

Other features of the described embodiments will be apparent from the accompanying drawings and from the detailed description that follows.

DETAILED DESCRIPTION

Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive (SSD).

In a NAND flash memory the memory cells can be arranged in rows and columns to form a non-volatile memory array referred to as a NAND array. In a 3D NAND memory array the memory cells are stacked in multiple layers. Data is read and written (programmed) page by page and erased block by block. A TLC NAND flash memory includes three pages (XP—extra, UP—upper, LP—lower) per wordline and a QLC NAND flash memory includes four pages (TP—top, XP, UP, LP) per wordline. A PLC NAND flash memory includes five pages. A wordline in a sub-block of a block-addressable NAND device can be used to program multiple pages worth of data. For example, a wordline in a sub-block of a block-addressable QLC NAND device can be used to program four pages worth of data as compared to a TLC NAND device, in which the wordline can be used to program only three pages worth of data.

In a TLC memory cell, eight different threshold voltage levels (Vt) may be used to represent three bits of data. The first bit is LP data, the second bit is UP data, and third bit of data is XP data. The eight different threshold voltage levels (Vt) are referred to as Level 0 (L0), Level 1 (L1), Level 2 (L2) and so forth up to Level 7 (L7). In a QLC memory cell, sixteen different threshold voltage levels (Vt) may be used to represent four bits of data in four pages of data, in TP, XP, UP and LP pages. In a one-pass programming algorithm, the voltages for all of the levels are programmed in the memory cell using a series of pulses until the desired voltage levels are reached.

Generation to generation, as NAND density increases, program performance of TLCs, QLCs and other higher density NAND needs to be improved in order to meet and/or exceed sequential-write and random-write SSD bandwidth for smaller density devices, such as SLCs.

NAND total program time, referred to herein as tPROG, consists of input/output (I/O) latency (data input) plus the time needed to program the NAND array with data. With a one-pass programming algorithm in a TLC, total I/O latency is equal to the I/O latency per plane times the number of planes times the number of pages. As an example, I/O latency expressed in microseconds (µs) in a memory module with a per plane I/O latency of 15 µs and 1800 mega transfers per second (MT/s) is:

$$15\ \mu s * 4 * 3 = \sim 180\ \mu s.$$

To overcome the challenges posed by NAND density, dynamic program caching as described in the embodiments that follow enables at least some of the I/O latency comprising the NAND program time to occur in parallel with an initial portion of a program algorithm.

With reference to FIG. 1, selected components of a memory device 100 in which dynamic program caching can be implemented includes a NAND device 102 having a NAND array 104 and a NAND periphery 108 in communication with a bus 111 to a host interface (not shown). The NAND array 104 comprises the physical NAND pages 106 of non-volatile memory, such as the LP 106a, UP 106b and XP 106c physical pages. The NAND device includes a NAND Cache Register 109 and a NAND Data Register 110 to facilitate reducing latency of a program operation performed in accordance with embodiments of dynamic program caching.

In one embodiment, the selected components of the memory device 100 further include a controller 114. Among other components, the controller 114 can include core firmware 116 and a command queue 118. The command queue 118 is used to queue commands to issue to the NAND array 104, such as commands to write, read, program, program-page, program-prologue, program pulse-verify, program-epilogue, program suspend, program resume, etc. During operation, the controller 114 can initiate NAND processes 112 in accordance with a command logic, such as command logic embodied in the core firmware 116.

In one embodiment, the command logic is performed in accordance with a dynamic program caching mode 122 and a page/level encoding 120. For example, the dynamic program caching mode 122 can be embodied in a mode register to indicate whether dynamic program caching is active or inactive. In one embodiment the dynamic program caching mode 122 can default to an active mode of operation in the absence of a mode register setting. If active, the command logic initiates a program operation in dynamic program caching mode in accordance with a page/level encoding 120.

In a conventional programming flow, the operations for initiating a one-pass programming algorithm for a TLC NAND are sequenced to await completion of the data I/O operations for all pages before commencing the program operation, referred to below as tPROG. For example, the conventional programming flow might perform, in the following sequence:
1. Issue Program-Page (80 h–11 h, . . . , 80 h–10 h) with XP Page Data
2. Wait tPBSY
3. Issue Program-Page (80 h–11 h, . . . , 80 h–10 h) with UP Page Data
4. Wait tPBSY
5. Issue Program-Page (80 h–11 h, . . . , 80 h–10 h) with LP Page Data
6. Wait tPROG To overcome this limitation, in one embodiment, the page/level encoding 120 provides a means for determining whether a program operation can be initiated without having to wait for all pages of data to be loaded. For example, the page/level encoding 120 for a TLC program operation can provide a means for determining whether the TLC program operation can be initiated with just the XP page data loaded to the NAND device 102 in preparation for programming the corresponding NAND physical page 106, e.g., XP 106c. If so, then the program operation can be performed in dynamic program caching mode. That is, one or more portions of the program operation, tPROG, can be performed in parallel, at least in part, while the remaining pages (e.g., the UP and LP pages) are loaded to the NAND device 102 (in preparation for being programmed to the corresponding NAND physical pages 106, e.g. LP 106a and UP 106b). Performing one or more of the portions of the program operation in parallel, at least in part, is to perform at least a portion of the program operation concurrently with the data I/O operations for one or more of the remaining pages.

Figure 2:
FIG. 2 is an example sequence of commands for dynamic program caching in accordance with various examples described herein.

FIG. 2 illustrates an example sequence of operations 200 performed in accordance with embodiments of dynamic program caching. Compared to the conventional programming flow described above, the sequence of operations 200 performed in accordance with embodiments of dynamic program caching includes operations to perform a portion of the program operation parallel to the command-cycle, address-cycle, and data-input to improve the overall program latency.

For example, with reference to FIG. 2, in one embodiment a program operation, referred to as tPROG, can be divided into three portions: (1) Program-Prologue, (2) Pulse-Verify-Loops for the threshold voltage levels (Vt), e.g., L1-L7, and (3) Program-Epilogue. The Program-Prologue operation warms up the pumps for the program operation and performs all logic calculations required for a voltage and a timing of the subsequent Pulse-Verify Loops. After the first page Data I/O operation is complete, the Program-Prologue and L1 Pulse-Verify Loop can run in parallel, at least in part, with the remaining pages of Data I/O operations to minimize the effective program-time of tPROG.

In the example embodiment illustrated in FIG. 2, a TLC tPROG is initiated by providing appropriate command-cycle, address-cycle, and data to the NAND device to program each of the pages (LP, UP, XP) using the threshold voltage levels (Vt) L1-L7. As shown, the first and third commands in the sequence of operations 200, the Issue-Program-Page commands, with XP page data (the first page of data) and UP page data (the next page of data), are issued with a Program Page Cache Mode (80 h–15 h) operation instead of a regular Program Page (80 h–10 h) operation. The Program Page Cache Mode (80-15 h) operation causes the data to be sent to the NAND cache register 109, in preparation for subsequent transfer to the NAND data register 110 (and from which the data is programmed to the NAND physical pages). The second and fourth commands in the sequence of operations 200 are then able to perform the first two portions of the tPROG operation, Program-Prologue and the first L1 Pulse-Verify Loop, in parallel, at least in part, with the loading of the LP data and, in some cases, in parallel, at least in part, with the loading of the UP data depending on when the I/O operations start and how long it takes them to reach completion.

Figure 3:
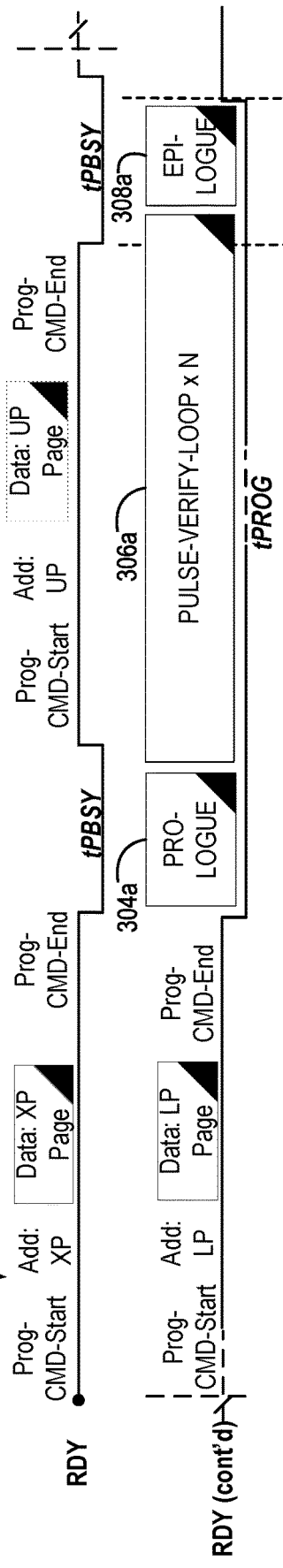
FIG. 3 is a timeline diagram comparing an example sequence of commands with and without dynamic program caching in accordance with various examples described herein.
Figure 3:
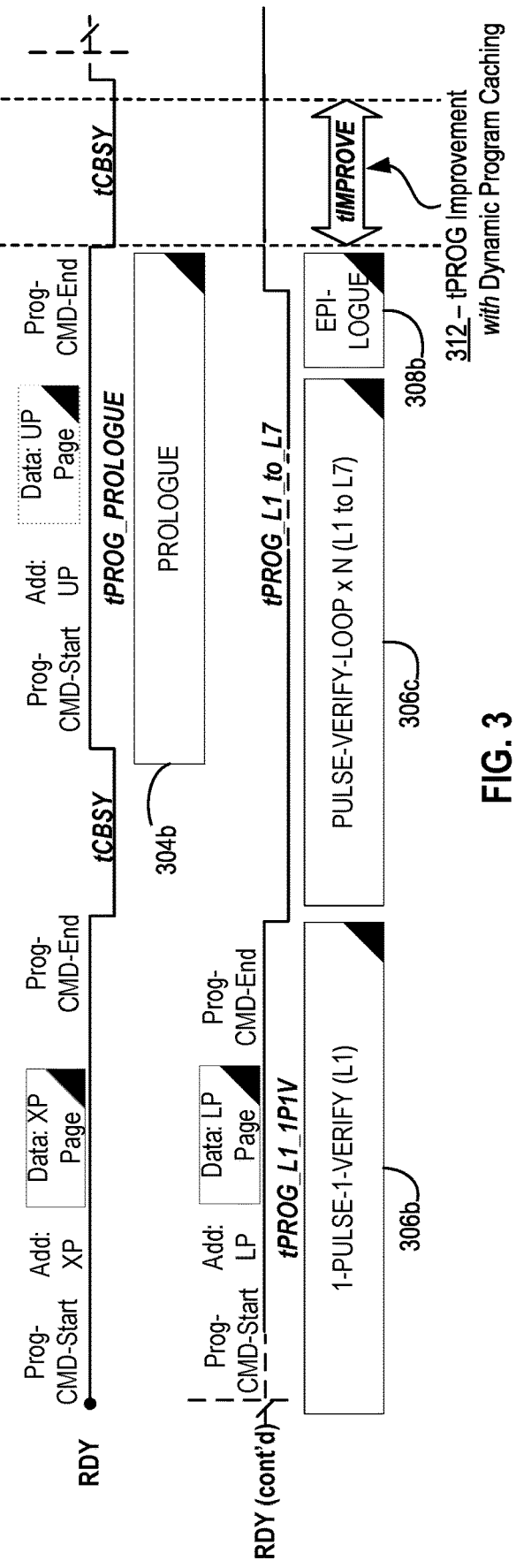

By way of example only, and not limitation, FIG. 3 is a timeline diagram comparing a sequence of commands performed with and without dynamic program caching in accordance with various examples described herein. For comparison purposes only, FIG. 3 depicts the sequence of operations without dynamic program caching 302 positioned above the sequence of operations with dynamic program caching 310.

It should be noted that the timeline (RDY) depicted in the timeline diagram of FIG. 3 is representational only for the purpose of relative comparison, and that exact start and stop times are not shown, nor is the timeline drawn to any exact scale. In addition, although the example described in FIG. 3 and examples described elsewhere refer to embodiments of dynamic program caching for a TLC memory, other types of MLC memory can benefit from the embodiments of dynamic program caching, including QLC and PLC memories with greater density and more voltage levels than TLC memory.

With reference to FIG. 3, for a conventional program sequence of operations without dynamic program caching 302, all three data I/O operations for programming the XP, UP and LP pages of data in a TLC memory are completed in sequence before attempting the tPROG operation comprising the Program-Prologue portion 304a, the Pulse-Verify Loop portions (for each level L1-L7) 306a and the Program-Epilogue portion 308a.

In contrast, for the sequence of operations with dynamic program caching 310, after the I/O operation for the XP page reaches completion, the data I/O operation for programming the UP page of data can be executed in parallel, at least in part, with the Program-Prologue portion 304b. Likewise, the data I/O operation for programming the LP page of data can be executed in parallel, at least in part, with the Pulse-Verify Loop portion for the L1 level 306b, followed by the remaining Pulse-Verify Loop portions for the remaining levels 306c and the Program Epilogue portion 308b. By executing the portions of the tPROG in parallel, at least in part, with the UP and LP data I/O operations, performing operations in a program sequence with dynamic program caching results in an improved program latency, labeled in FIG. 3 as tIMPROVE 312. By way of example only, and not limitation, embodiments of a dynamic program caching can improve program latency of a TLC 3D NAND component by approximately 10%. In addition, embodiments of dynamic program caching can improve sequential-write and random-write performance by approximately 5-8% in lower TeraByte TLC SSD devices (8 TB or less).

Figure 4A:
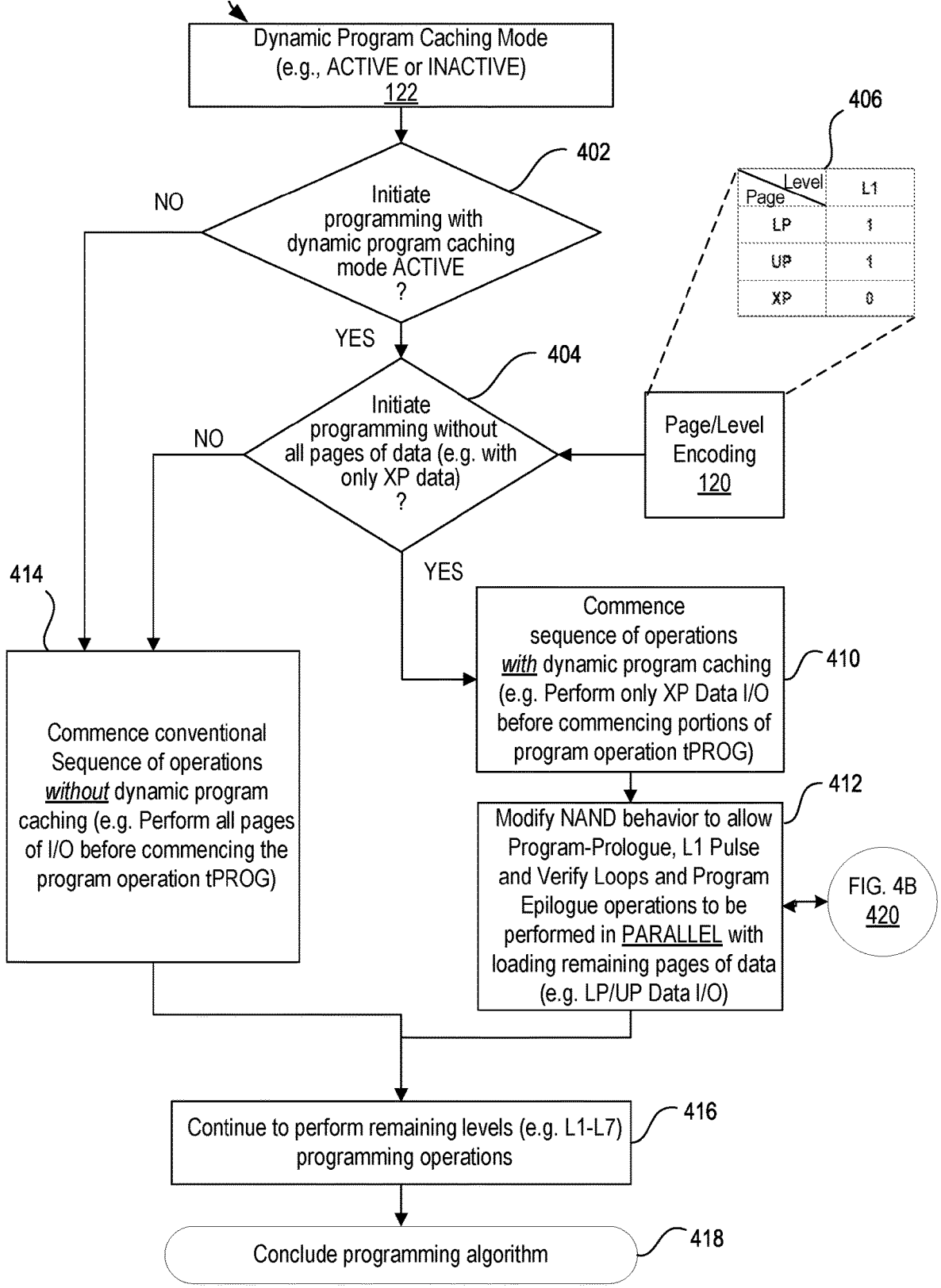
FIGS. 4A-4B are process diagrams illustrating process flows with dynamic program caching in accordance with various examples described herein.
Figure 4B:
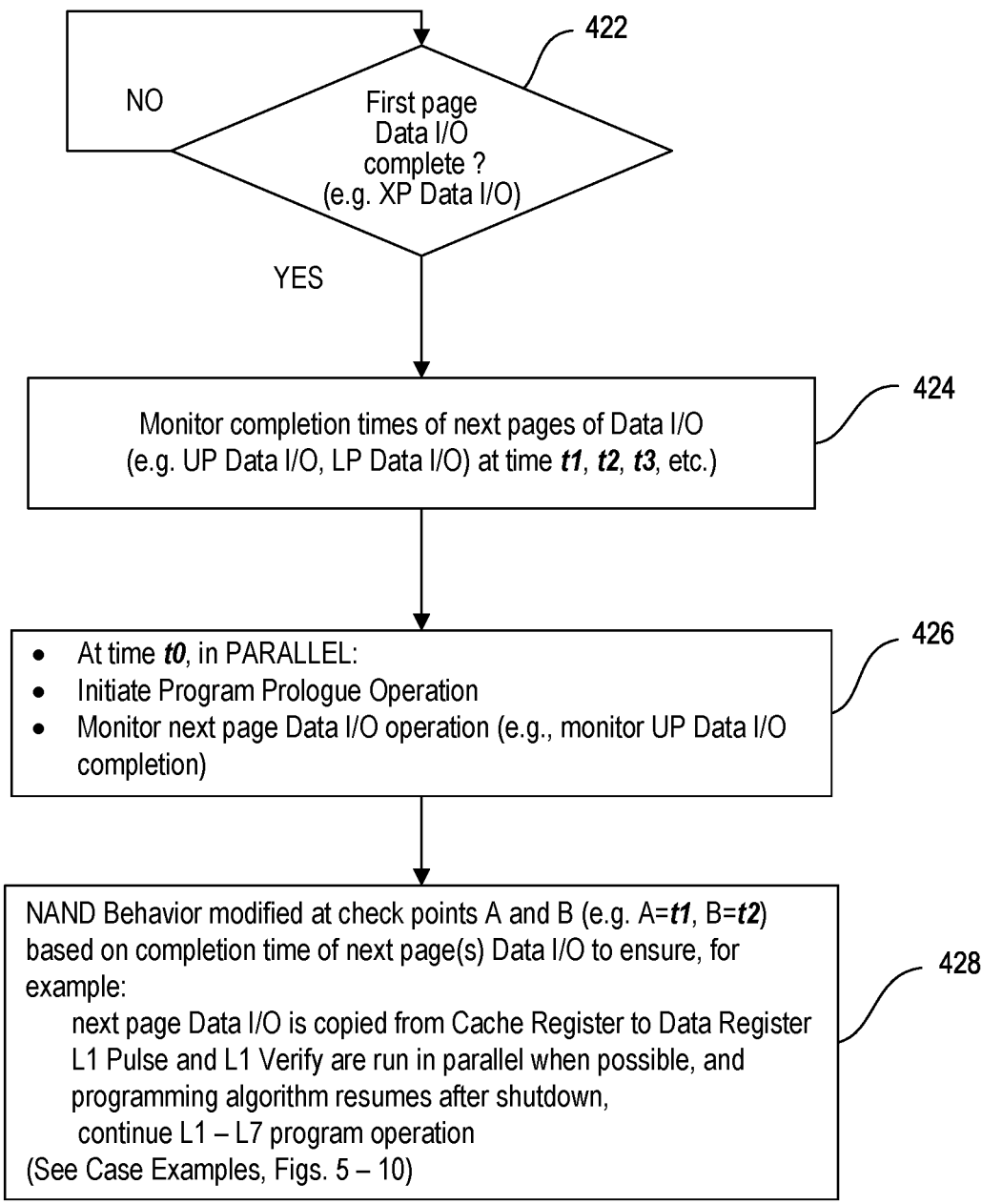

FIGS. 4A-4B are process diagrams illustrating process flows for performing a sequence of operations with dynamic program caching for a TLC NAND in accordance with various examples described herein. Similar process flows can be used for embodiments of a dynamic program caching for higher density NAND, such as QLC and PLC NAND as well.

In FIG. 4A, an embodiment of the process 400 begins at decision block 402 when the controller determines whether dynamic program caching mode 122 is active or inactive. If not active (or if it defaults to active), the process 400 commences at block 414 a conventional sequence of operations without dynamic program caching. However, if dynamic program caching mode is active, the process 400 continues at decision block 404 to determine whether to initiate programming without all pages of data (e.g., with only XP data), based on the page/level encoding 120.

It should be noted that, in one embodiment, a processor (FIG. 11, 1110) can enable or disable a dynamic program caching mode 122 by issuing a trim operation for NAND memory. In one embodiment, the memory controller (FIG. 11, 1120) monitors a status behavior of the NAND. If a NAND memory reports a status "0xC0", for example, then the memory controller (FIG. 11, 1120) determines that the dynamic program caching mode 122 is active. The dynamic program caching mode 122 status can be conveyed to a controller capable of programming a NAND device in accordance with the process 400 described herein.

In one embodiment, by way of example only and not limitation, an awareness that the NAND behavior should be modified to ensure that the programming algorithm initiated by the tPROG program operation is properly executed when performing the program operation in dynamic program caching mode is conveyed to the NAND device via the type of command the controller uses to issue the program-page command that initiates the data I/O operation with the first page of data. For example, using the above-described page/level encoding 120 in which only the XP data need be loaded before commencing the portions of the tPROG operation to execute in parallel, at least in part, with loading the remaining pages of data, in one embodiment the controller may issue the Program Page Cache Mode (80 h-15 h) operation instead of a regular Program Page (80 h-10 h) operation. The receipt of the Program Page Cache Mode (80 h-15 h) operation could be sufficient to alert the NAND device to modify the NAND behavior to run in dynamic program caching mode. In addition, the Program Page Cache Mode (80 h-15 h) operation causes the page data to be sent to the cache register of the NAND device instead of the data register. This enables, in part, the NAND behavior to be modified to allow the portions of the tPROG operation, e.g., the program-prologue and the first L1 pulse-verify loop, to be executed in parallel, at least in part, with the Data I/O operations for the next/remaining pages of data.

By way of example only and not limitation, FIG. 4A illustrates an example page/level encoding 406 for each page (LP, UP, XP) at L1 of a TLC NAND. In this case the page/level encoding indicates the presence of data with a program bit value "0" and the absence of data with an erasure bit value "1". In this example, the decision block 404 reaches a determination of yes—the program operation can be initiated without all pages of data—because only the XP page contains data (since it is the only page with a program bit value "0"). Hence, the Program-Prologue and L1 Pulse-Verify loop portions of the program operation can be performed solely based on XP data. In other examples, other pages might contain data, such as UP and XP pages. In other embodiments, an example page/level encoding 406 can encode additional pages, such as an encoding for the presence or absence of data in pages (TP, LP, UP, XP) at L1 of a QLC NAND. In one example, two pages can contain data at L1, such as pages UP and XP, and two pages might not contain data at L1, such as TP and LP. In such cases, the program operation could be initiated without all pages of data in accordance with embodiments of dynamic program caching after loading only the UP and XP data.

In other embodiments, other means for determining whether a program operation can be initiated without all pages of data can be employed. For example, there may be other means to determine whether a page contains data at L1, directly or indirectly, without consulting the page/level encoding 406.

If the decision block at 404 determines that the program operation cannot be initiated without all pages of data, then the process 400 continues at block 414 with the commencement of a conventional sequence of operations without dynamic program caching. This scenario could occur, for example, if the page/level encoding 120 indicated that all pages (LP, UP, XP) contained a program bit "0" at L1. In that case, even if the dynamic program cache mode is active, the conventional sequence of operations would be performed.

In one embodiment, the process 400 continues at block 410 to commence the program operation with dynamic program caching. For example, the process 400 initiates only the XP Data I/O operation before commencing the tPROG program operation. At block 412, the process 400 continues in the NAND memory, wherein the NAND behavior is modified to allow portions of the tPROG program operation (e.g., the Program-Prologue, the L1 Pulse-Verify Loop and the Program-Epilogue) to be performed in parallel, at least in part, with the remaining pages I/O data loading (e.g., the LP and UP Data I/O operations) and to ensure the programming algorithm initiated by the tPROG program operation is properly executed. Additional details regarding the modification of the NAND behavior is detailed at process 420 in FIG. 4B.

In one embodiment, once the portions of the tPROG program operation executed in parallel, at least in part, with the remaining pages I/O data loading are complete, the process 400 continues at 416 to continue to perform the other program operations (e.g., the Pulse Verify Loops for L1-L7) as usual, and at termination block 418 the process 400 concludes the processes for programming a TLC with dynamic program caching.

With reference to FIG. 4B, embodiments of process 420 begin at decision block 422 to determine whether the first page Data I/O operation is complete (e.g., the XP Data I/O). Once complete, the process 420 for programming a TLC with dynamic program caching continues at block 424 to activate a monitoring process at certain time intervals, e.g., t1, t2, t3, etc., to monitor the completion times of the next pages Data I/O operations, (e.g., the LP and UP Data I/O operations). The completion times of the next pages Data I/O operations are used to determine how to modify the behavior of the NAND device to ensure that the programming algorithm initiated by the portions of the tPROG program operation is properly executed when performing the program operation in the dynamic program caching mode.

In one embodiment, the process 420 continues at block 426 to initiate the Program Prologue portion of tPROG at a point in time, e.g., to, and begin monitoring when the next page Data I/O operation reaches completion, e.g., UP Data I/O. At block 428, at the next two points in time, e.g., t1 and t2, herein referred to respectively as checkpoint A and checkpoint B, the NAND behavior is modified. In one embodiment, the modifications include copying next page data to a data register from the cache register of the NAND device, executing the L1 Pulse-Verify Loop in parallel, at least in part, with the next page Data I/O operations where possible, and resuming the operations for the programming algorithm after a shutdown. Additional details of the modifications to the NAND behavior is illustrated by the different scenarios depicted in FIGS. 5-10.

By way of example only, and not limitation, FIGS. 5-10 illustrate different scenarios in which embodiments of dynamic program caching can be employed. Specifically, FIGS. 5-10 depicts different windows of time, during which the one or more next/remaining pages of data can be loaded to the NAND, e.g. the UP and LP data loading operations, based in part on when a user issues the Program-Command for the UP/LP pages.

In one embodiment, the different scenarios illustrated in FIGS. 5-10 take into consideration the timing of the Data I/O operations for the next/remaining pages of data, specifically when the next/remaining page Data I/O operations reach completion. The sequence of operations that occur during different windows of time illustrate how a NAND device responds to loading the one or more next/remaining pages while in dynamic program caching mode.

As noted earlier (with reference to FIG. 3) the timeline (RDY) depicted in the timeline diagrams of FIGS. 5-10 is representational only for the purpose of illustrating different start and stop times of the various commands and operations depicted, and that exact start and stop times are not shown, nor is the timeline drawn to any exact scale.

Figure 5:
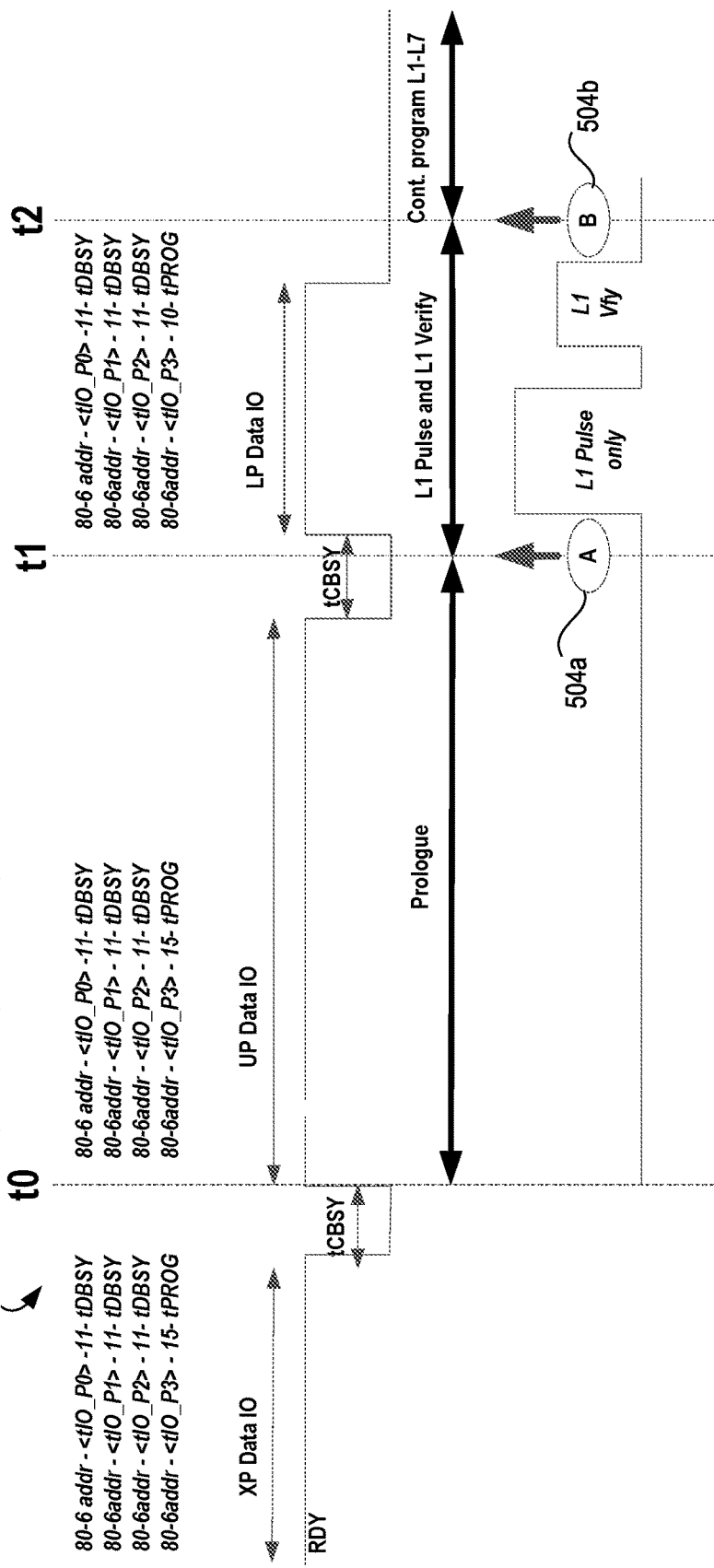
FIGS. 5-10 are timeline diagrams illustrating different case scenarios in which an example sequence of commands and/or operations with dynamic program caching is processed in accordance with various examples described herein.

With reference to FIG. 5, in example scenario case #1 500, the Prologue portion of tPROG is run parallel to the UP Data I/O operation and the L1 Pulse-Verify Loop portion of tPROG is run parallel to the LP Data I/O operation. In this example, the program operation 502 shows that the UP Data I/O operation reaches completion between t0 and t1 and the LP Data I/O operation reaches completion between t1 and t2. In this case, the modifications to the NAND behavior 504 includes, at checkpoint A 504a, copying the UP data to the data register from the cache register, and at checkpoint B 504b, continuing with the Pulse-Verify Loops for L1-L7.

Figure 6:
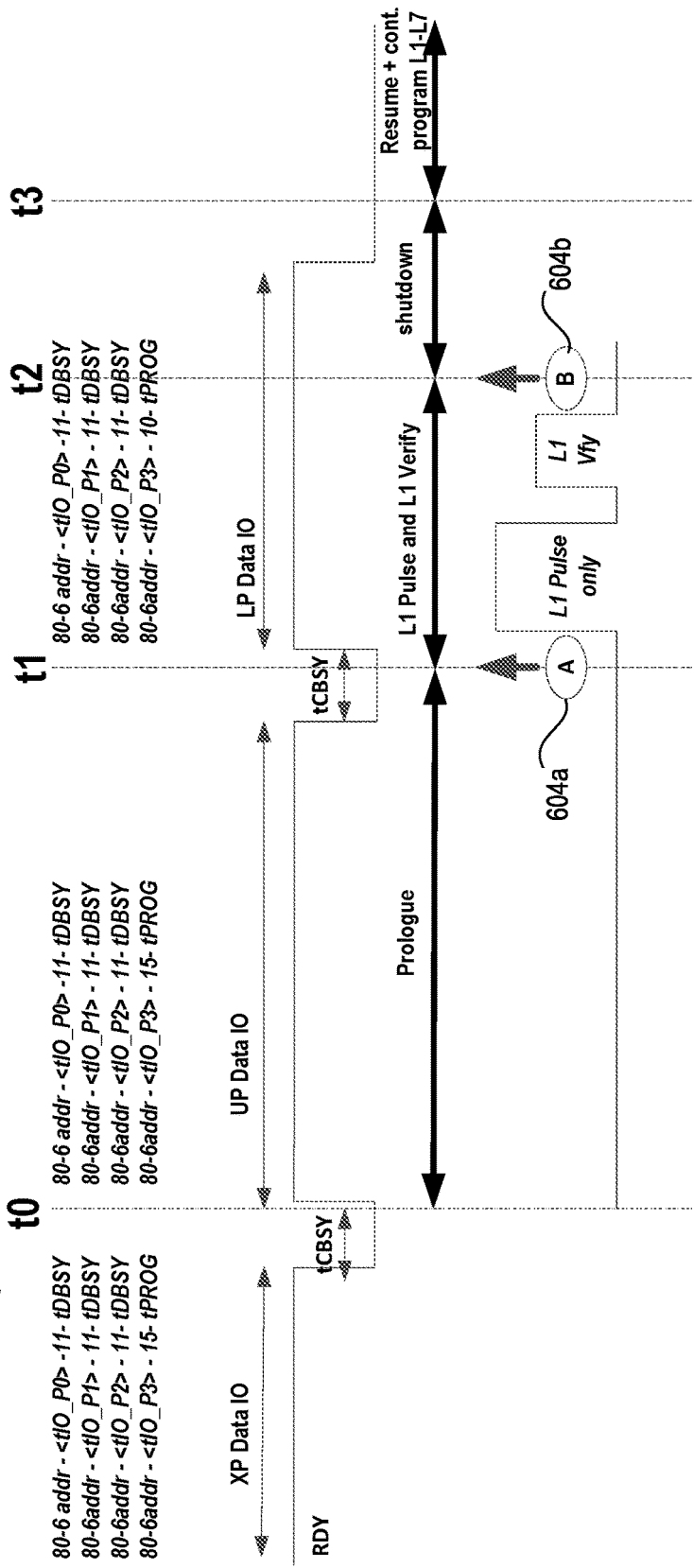

With reference to FIG. 6, in example scenario case #2 600, the Prologue portion of tPROG is run parallel to the UP Data I/O operation and the L1 Pulse-Verify Loop portion of tPROG is run parallel to the LP Data I/O operation. In this example, the program operation 602 shows that, as in the previous example scenario, the UP Data I/O operation reaches completion between t0 and t1. But the LP Data I/O operation reaches completion later, between t2 and t3. In this case, the modifications to the NAND behavior 604 includes, at checkpoint A 604a, copying the UP data to the data register from the cache register, and at checkpoint B 604b, entering a shutdown until reaching t3, and then immediately resuming the Pulse-Verify Loops for L1-L7 after shutdown.

Figure 7:
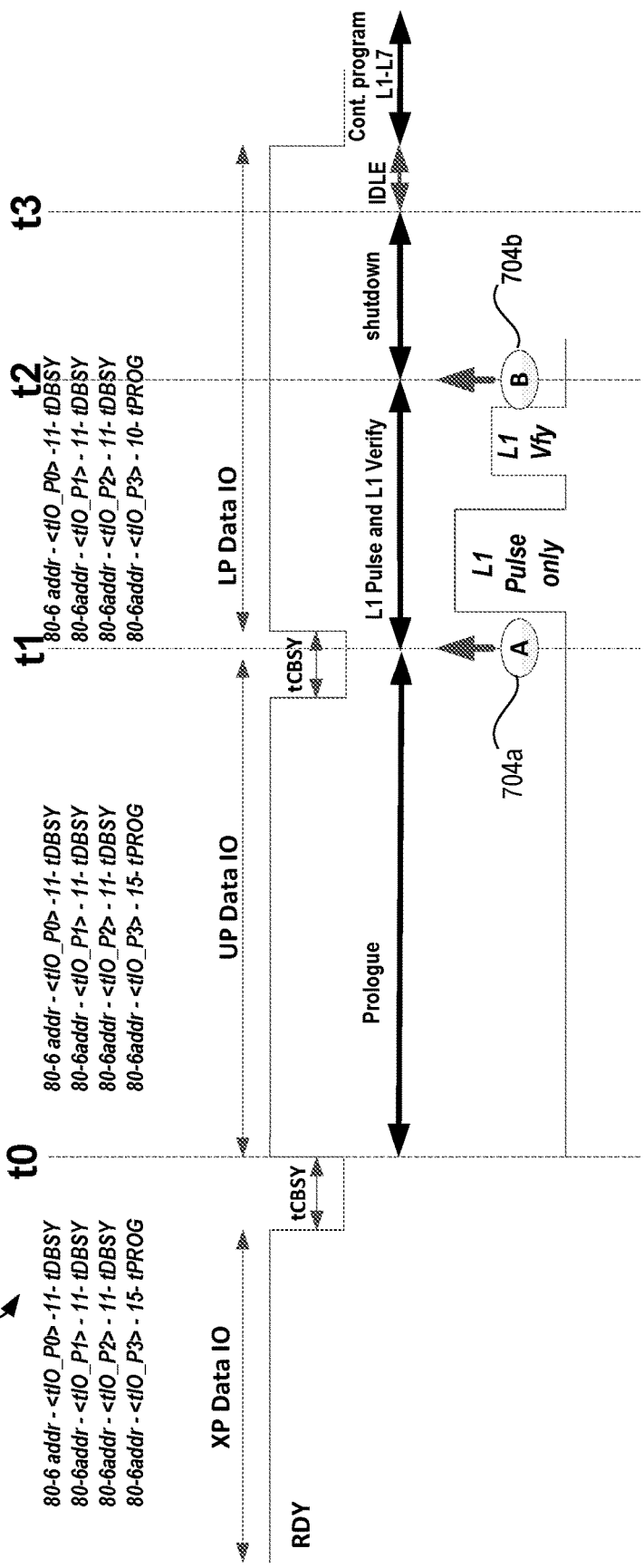

With reference to FIG. 7, in example scenario case #3 700, the Prologue portion of tPROG is run parallel to the UP Data I/O operation and the L1 Pulse-Verify Loop portion of tPROG is run parallel to the LP Data I/O operation. In this example, the program operation 702 shows that, as in the previous example scenarios, the UP Data I/O operation reaches completion between t0 and t1. But the LP Data I/O operation reaches completion significantly later, in this case after t3. For this example scenario, modifications to the NAND behavior 704 includes, at checkpoint A 704a, copying the UP data to the data register from the cache register, and at checkpoint B 704b, entering a shutdown until reaching t3, remaining idle until the LP Data I/O operation reaches completion, and then immediately resuming the Pulse-Verify Loops for L1-L7 after idling.

Figure 8:
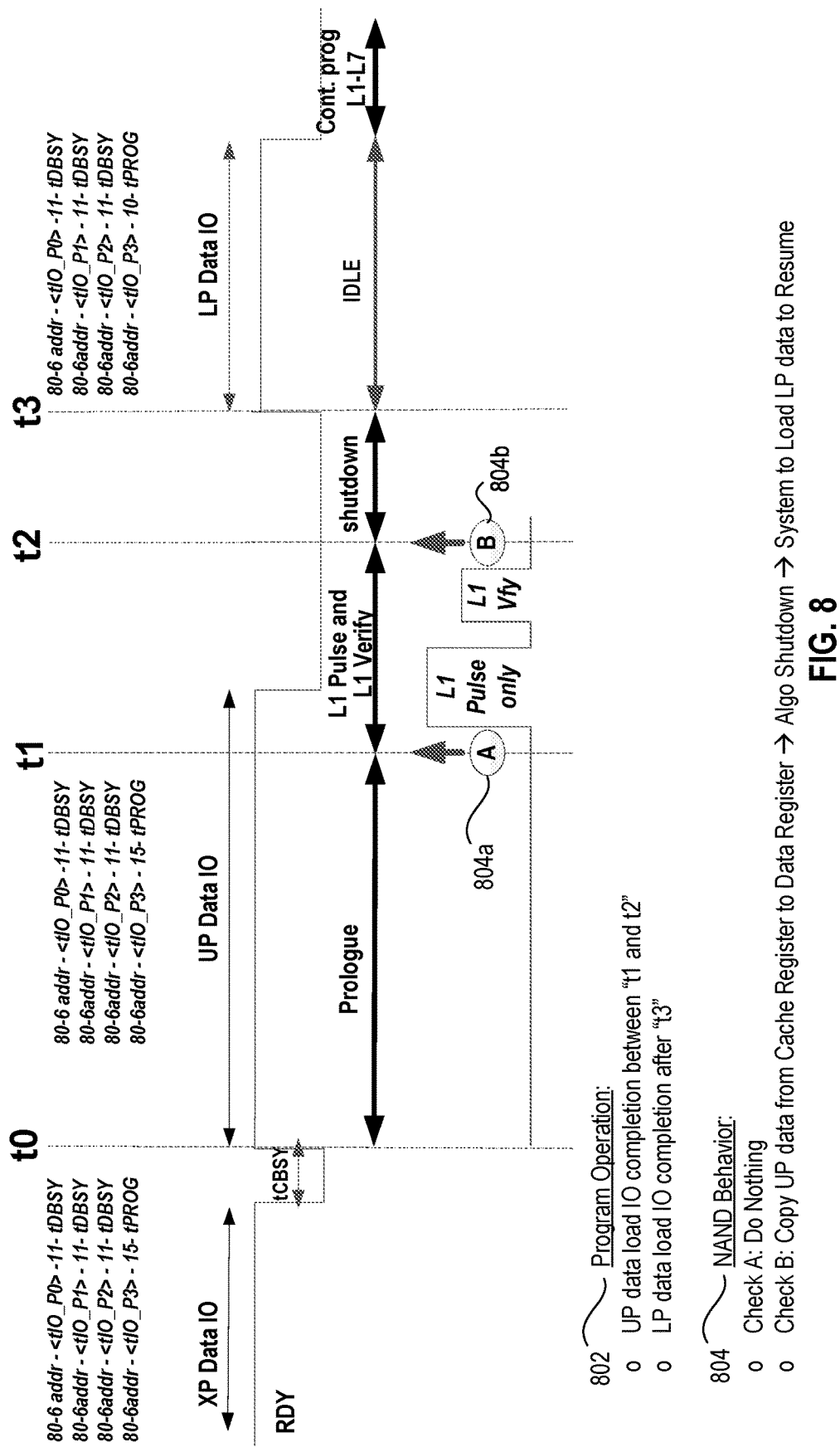

With reference to FIG. 8, in example scenario case #4 800, the Prologue portion of tPROG runs parallel to the UP Data I/O operation and the L1 Pulse-Verify Loop portion of tPROG commences while the UP Data I/O operation is still running. In this example, the program operation 802 shows that, unlike the previous example scenarios, the UP Data I/O operation reaches completion later, between t1 and t2, and the LP Data I/O operation does not even start until t3. For this example scenario, there are no modifications to the NAND behavior 804 at checkpoint A 804a since the UP Data I/O operation is not yet complete. At checkpoint B 804b, modifications to the NAND behavior 804 include copying the UP data to the data register from the cache register since the UP Data I/O is, by then, complete. Checkpoint B 804b also includes modifications to enter a shutdown until reaching t3, remaining idle until the LP Data I/O operation reaches completion, and finally immediately resuming the Pulse-Verify Loops for L1-L7 after idling.

Figure 9:
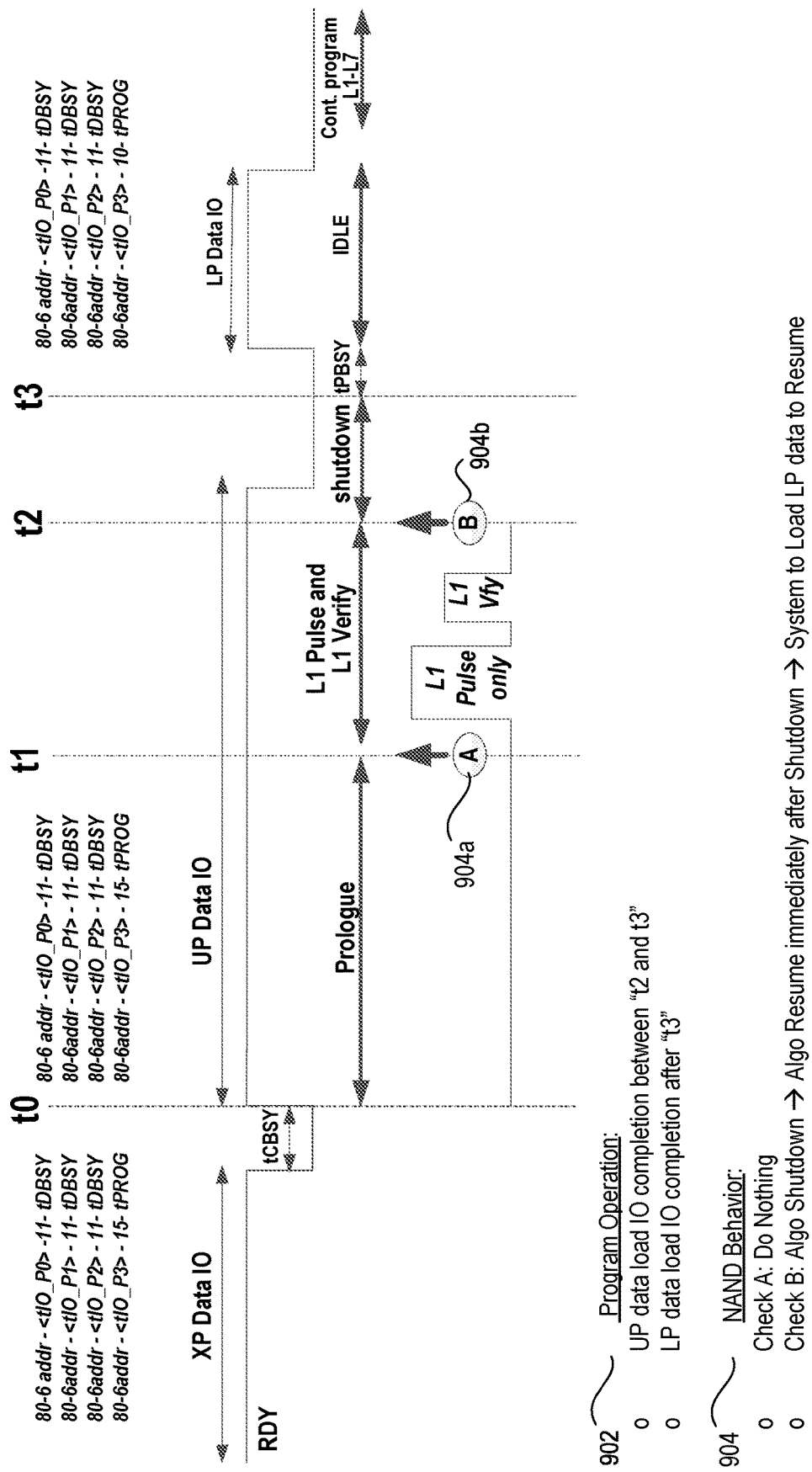

With reference to FIG. 9, in example scenario case #5 900, both the Prologue and the L1 Pulse-Verify Loop portions of tPROG run parallel to the UP Data I/O operation. In this example, the program operation 902 shows that the UP Data I/O operation reaches completion much later than in the previous scenarios, between t2 and t3, and the LP Data I/O operation does not even start until t3. For this example scenario, there are no modifications to the NAND behavior 904 at checkpoint A 904a since the UP Data I/O operation is not yet complete. At checkpoint B 904b, modifications to the NAND behavior 904 include entering a shutdown until reaching t3, remaining idle until the LP Data I/O operation reaches completion, and finally immediately resuming the Pulse-Verify Loops for L1-L7 after the LP Data I/O operation reaches completion. Modification to move the UP data to the data register from the cache register is not needed in this example scenario since the tPBSY occurred at t3 after the UP Data I/O operation reached completion.

Figure 10:
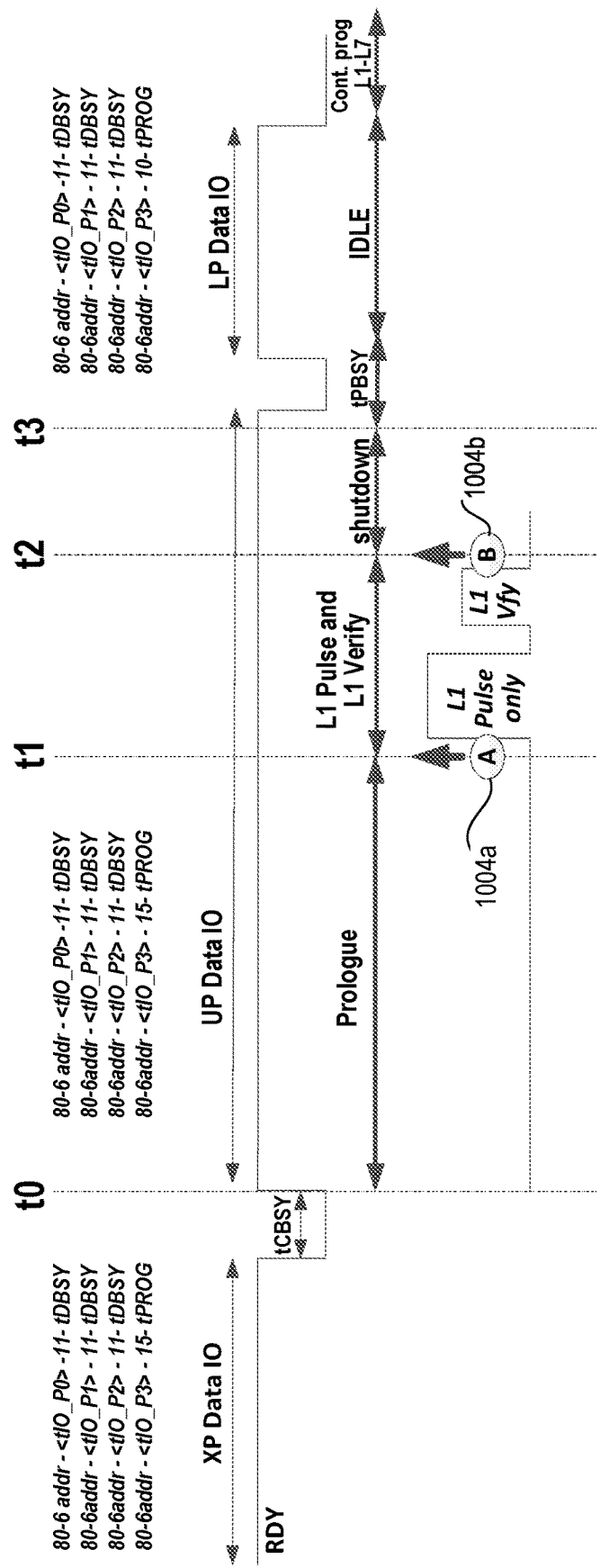

With reference to FIG. 10, in example scenario case #6 1000, both the Prologue and the L1 Pulse-Verify Loop portions of tPROG run parallel to the UP Data I/O operation. In this example, the program operation 1002 shows that the UP Data I/O operation reaches completion much later than in the previous scenarios, after t3, and the LP Data I/O operation starts after completion of the UP Data I/O operation. For this example scenario, there are no modifications to the NAND behavior 1004 at checkpoint A 1004*a* since the UP Data I/O operation is not yet complete. At checkpoint B 1004*b*, modifications to the NAND behavior 1004 include entering a shutdown between t2 and t3, completing the UP Data I/O operation to resume, copying the UP data to the data register from the cache register, remaining idle until the LP Data I/O operation reaches completion, and then resuming the Pulse-Verify Loops for L1-L7.

Figure 11:
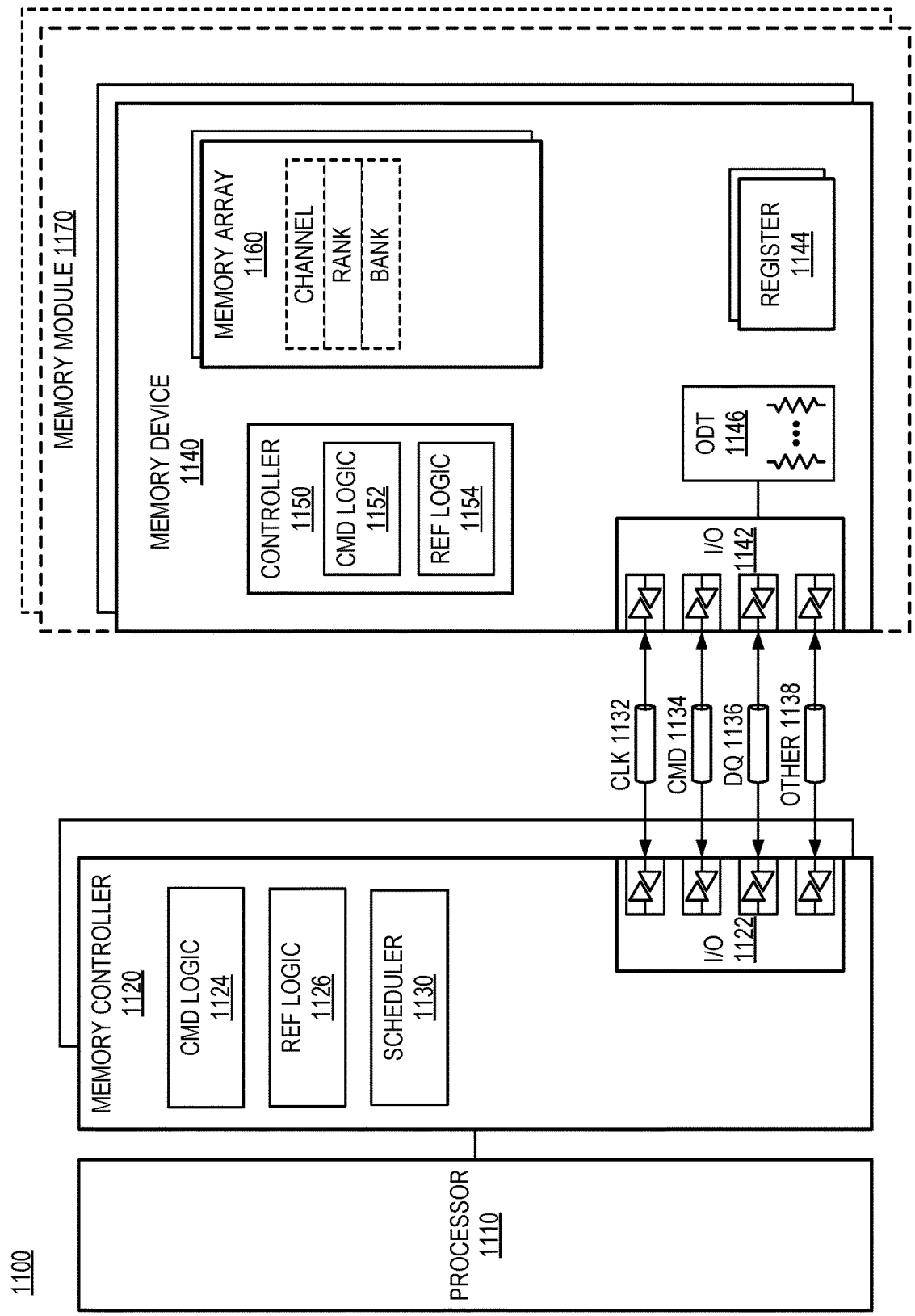
FIG. 11 is a block diagram of an embodiment of a system in which dynamic program caching can be implemented in accordance with various examples described herein.

FIG. 11 is a block diagram of an example of a system 1100 in which dynamic program caching can be implemented. System 1100 includes a processor 1110 and elements of a memory subsystem in a computing device, including one or more memory controller(s) 1120 and memory device(s) 1140 contained in memory modules 1170. The computing device can include, but is not limited to, a server, a workstation computer, a desktop computer, a laptop computer, a tablet computer and/or a mobile device.

Processor 1110 represents a processing unit of a computing platform that may execute an operating system (OS) and applications, which can collectively be referred to as the host or the user of the memory. An OS can be implemented in software that manages computer hardware and other software including memory allocation and access to I/O devices. Examples of operating systems include Microsoft® Windows®, Linux®, iOS® and Android®.

The OS and applications execute operations that result in memory accesses. Processor 1110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. A GPU can include one or more GPU cores and a GPU cache which can store graphics related data for the GPU core. The GPU core can internally include one or more execution units and one or more instruction and data caches. Additionally, the GPU can contain other graphics logic units such as one or more vertex processing units, rasterization units, media processing units, and codecs.

Memory accesses may also be initiated by devices such as a network controller or hard disk controller. Such devices can be integrated with the processor in some systems or attached to the processer via a bus (e.g., PCIe), or a combination. System 1100 can be implemented as an SoC (system on a chip), or be implemented with standalone components. which combines processor, graphics, memory, and Input/Output (I/O) control logic into one SoC package.

Reference to memory device(s) 1140 can apply to different memory types. For example, memory device(s) 1140 can include volatile memory and nonvolatile memory. Volatile memory is memory whose state (and therefore the data stored on it) is indeterminate if power is interrupted to the memory device. Dynamic volatile memory requires refreshing the data stored in the memory device to maintain state. One example of dynamic volatile memory includes DRAM (dynamic random access memory), or some variant such as synchronous DRAM (SDRAM).

In contrast to volatile memory, nonvolatile memory is memory whose state is determinate even if power is interrupted to the memory device. In one example, the nonvolatile memory device is a block addressable memory device, such as a device that can use NAND (not AND) or NOR (not OR) technologies, multi-threshold level NAND flash memory, including single or multi-level Phase Change Memory (PCM), (for example, Single-Level Cell ("SLC"), Multi-Level Cell ("MLC"), Quad-Level Cell ("QLC"), Tri-Level Cell ("TLC"), and Penta-Level Cell ("PLC") or some other NAND).

In one embodiment, the memory device may be or may include memory devices that use chalcogenide glass, a resistive memory, nanowire memory, ferroelectric random-access memory (FeRAM), ferroelectric transistor random access memory (FeTRAM), anti-ferroelectric memory, nanowire-based non-volatile memory, memory that incorporates memristor technology, magnetoresistive random access memory (MRAM) memory that incorporates memristor technology, resistive memory including the metal oxide base, the oxygen vacancy base and the conductive bridge Random Access Memory (CB-RAM), spin-transfer torque memory (STT-RAM) or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

A memory subsystem as described herein may be compatible with a number of memory technologies, such as DDR4 (double data rate (DDR) version 4, JESD79-4, originally published in September 2012 by JEDEC, LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others, or combinations of memory technologies and technologies based on derivatives or extensions of such specifications.

Memory controller 1120 represents one or more memory controller circuits or devices for system 1100. Memory controller 1120 represents control logic that generates memory access commands in response to the execution of operations by processor 1110. Memory controller 1120 accesses one or more memory devices 1140. Memory devices 1140 can be DRAM devices in accordance with any referred to above. In one example, memory devices 1140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 1120 manages a separate memory channel, although system 1100 can be configured to have multiple channels managed by a single controller, or to have multiple controllers on a single channel. In one example, memory controller 1120 is part of host processor 1110, such as logic implemented on the same die or implemented in the same package space as the processor.

Memory controller 1120 includes I/O interface logic 1122 to couple to a memory bus, such as a memory channel as referred to above. I/O interface logic 1122 (as well as I/O interface logic 1142 of memory device 1140) can include pins, pads, connectors, signal lines, traces, or wires, or other hardware to connect the devices, or a combination of these. I/O interface logic 1122 can include a hardware interface. As illustrated, I/O interface logic 1122 includes at least drivers/transceivers for signal lines. Commonly, wires within an integrated circuit interface couple with a pad, pin, or connector to interface signal lines or traces or other wires between devices. I/O interface logic 1122 can include drivers, receivers, transceivers, or termination, or other circuitry or combinations of circuitry to exchange signals on the signal lines between the devices. The exchange of signals includes at least one of transmit or receive. While shown as coupling I/O 1122 from memory controller 1120 to I/O 1142 of memory device 1140, it will be understood that in an implementation of system 1100 where groups of memory devices 1140 are accessed in parallel, multiple memory devices can include I/O interfaces to the same interface of memory controller 1120. In an implementation of system 1100 including one or more memory modules 1170, I/O 1142 can include interface hardware of the memory module in addition to interface hardware on the memory device itself. Other memory controllers 1120 will include separate interfaces to other memory devices 1140. For example, I/O 1142 can also communicate with a solid-state drive ("SSD") which includes an SSD controller, a host interface, a volatile memory and a non-volatile memory device that includes one or more non-volatile memory arrays and controllers.

The bus between memory controller 1120 and memory devices 1140 can be implemented as multiple signal lines coupling memory controller 1120 to memory devices 1140. The bus may typically include at least clock (CLK) 1132, command/address (CMD) 1134, and write data (DQ) and read data (DQ) 1136, and zero or more other signal lines 1138. In one example, a bus or connection between memory controller 1120 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 1120 and memory devices 1140. An example of a serial bus technology is 8B10B encoding and transmission of high-speed data with embedded clock over a single differential pair of signals in each direction. In one example, CMD 1134 represents signal lines shared in parallel with multiple memory devices. In one example, multiple memory devices share encoding command signal lines of CMD 1134, and each has a separate chip select (CS_n) signal line to select individual memory devices.

It will be understood that in the example of system 1100, the bus between memory controller 1120 and memory devices 1140 includes a subsidiary command bus CMD 1134 and a subsidiary bus to carry the write and read data, DQ 1136. In one example, the data bus can include bidirectional lines for read data and for write/command data. In another example, the subsidiary bus DQ 1136 can include unidirectional write signal lines for write and data from the host to memory, and can include unidirectional lines for read data from the memory to the host. In accordance with the chosen memory technology and system design, other signals 1138 may accompany a bus or sub bus, such as strobe lines DQS. Based on design of system 1100, or implementation if a design supports multiple implementations, the data bus can have more or less bandwidth per memory device 1140. For example, the data bus can support memory devices that have either a x4 interface, a x8 interface, a x16 interface, or other interface. The convention "xW," where W is an integer that refers to an interface size or width of the interface of memory device 1140, which represents a number of signal lines to exchange data with memory controller 1120. The interface size of the memory devices is a controlling factor on how many memory devices can be used concurrently per channel in system 1100 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 1140 and memory controller 1120 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 1140 can transfer data on each UI. Thus, a x8 memory device operating on BL8 can transfer 84 bits of data (8 data signal lines times 8 data bits transferred per line over the burst). It will be understood that this simple example is merely an illustration and is not limiting.

Memory devices 1140 represent memory resources for system 1100. In one example, each memory device 1140 is a separate memory die. In one example, each memory device 1140 can interface with multiple (e.g., 2) channels per device or die. Each memory device 1140 includes I/O interface logic 1142, which has a bandwidth determined by the implementation of the device (e.g., x16 or x8 or some other interface bandwidth). I/O interface logic 1142 enables the memory devices to interface with memory controller 1120. I/O interface logic 1142 can include a hardware interface, and can be in accordance with I/O 1122 of memory controller, but at the memory device end. In one example, multiple memory devices 1140 are connected in parallel to the same command and data buses. In another example, multiple memory devices 1140 are connected in parallel to the same command bus, and are connected to different data buses. For example, system 1100 can be configured with multiple memory devices 1140 coupled in parallel, with each memory device responding to a command, and accessing memory resources 1160 internal to each. For a Write operation, an individual memory device 1140 can write a portion of the overall data word, and for a Read operation, an individual memory device 1140 can fetch a portion of the overall data word. The remaining bits of the word will be provided or received by other memory devices in parallel.

In one example, memory devices 1140 are disposed directly on a motherboard or host system platform (e.g., a PCB (printed circuit board) on which processor 1110 is disposed) of a computing device. In one example, memory devices 1140 can be organized into memory modules 1170. In one example, memory modules 1170 represent dual inline memory modules (DIMMs). In one example, memory modules 1170 represent other organization of multiple memory devices to share at least a portion of access or control circuitry, which can be a separate circuit, a separate device, or a separate board from the host system platform. Memory modules 1170 can include multiple memory devices 1140, and the memory modules can include support for multiple separate channels to the included memory devices disposed on them. In another example, memory devices 1140 may be incorporated into the same package as memory controller 1120, such as by techniques such as multi-chip-module (MCM), package-on-package, through-silicon via (TSV), or other techniques or combinations. Similarly, in one example, multiple memory devices 1140 may be incorporated into memory modules 1170, which themselves may be incorporated into the same package as memory controller 1120. It will be appreciated that for these and other implementations, memory controller 1120 may be part of host processor 1110.

Memory devices 1140 each include one or more memory arrays 1160. Memory array 1160 represents addressable memory locations or storage locations for data. Typically, memory array 1160 is managed as rows of data, accessed via wordline (rows) and bitline (individual bits within a row) control. Memory array 1160 can be organized as separate channels, ranks, and banks of memory. Channels may refer to independent control paths to storage locations within memory devices 1140. Ranks may refer to common locations across multiple memory devices (e.g., same row addresses within different devices) in parallel. Banks may refer to sub-arrays of memory locations within a memory device 1140. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 1140 include one or more registers 1144. Register 1144 represents one or more storage devices or storage locations that provide configuration or settings for the operation of the memory device. In one example, register 1144 can provide a storage location for memory device 1140 to store data for access by memory controller 1120 as part of a control or management operation. In one example, register 1144 includes one or more mode registers. In one example, register 1144 includes one or more multipurpose registers. The configuration of locations within register 1144 can configure memory device 1140 to operate in different "modes," where command information can trigger different operations within memory device 1140 based on the mode. Additionally or in the alternative, different modes can also trigger different operation from address information or other signal lines depending on the mode. Settings of register 1144 can indicate configuration for I/O settings (e.g., timing, termination or ODT (on-die termination) 1146, driver configuration, or other I/O settings). In one embodiment, a setting of register 1144 can indicate whether the memory includes configurable ECC memory that can be configured using a translation cache in accordance with the described embodiments.

In one example, memory device 1140 includes ODT 1146 as part of the interface hardware associated with I/O 1142. ODT 1146 can be configured as mentioned above, and provide settings for impedance to be applied to the interface to specified signal lines. In one example, ODT 1146 is applied to DQ signal lines. In one example, ODT 1146 is applied to command signal lines. In one example, ODT 1146 is applied to address signal lines. In one example, ODT 1146 can be applied to any combination of the preceding. The ODT settings can be changed based on whether a memory device is a selected target of an access operation or a non-target device. ODT 1146 settings can affect the timing and reflections of signaling on the terminated lines. Careful control over ODT 1146 can enable higher-speed operation with improved matching of applied impedance and loading. ODT 1146 can be applied to specific signal lines of I/O interface 1142, 1122 (for example, ODT for DQ lines or ODT for CA lines), and is not necessarily applied to all signal lines.

Memory device 1140 includes controller 1150, which represents control logic within the memory device to control internal operations within the memory device. For example, controller 1150 decodes commands sent by memory controller 1120 and generates internal operations to execute or satisfy the commands. Controller 1150 can be referred to as an internal controller, and is separate from memory controller 1120 of the host. Controller 1150 can determine what mode is selected based on register 1144, and configure the internal execution of operations for access to memory resources 1160 or other operations based on the selected mode. Controller 1150 generates control signals to control the routing of bits within memory device 1140 to provide a proper interface for the selected mode and direct a command to the proper memory locations or addresses. Controller 1150 includes command logic 1152, which can decode command encoding received on command and address signal lines. Thus, command logic 1152 can be or include a command decoder. With command logic 1152, memory device can identify commands and generate internal operations to execute requested commands.

Referring again to memory controller 1120, memory controller 1120 includes command (CMD) logic 1124, which represents logic or circuitry to generate commands to send to memory devices 1140. The generation of the commands can refer to the command prior to scheduling, or the preparation of queued commands ready to be sent. The signaling in memory subsystems generally includes address information within or accompanying the command to indicate or select one or more memory locations where the memory devices should execute the command. In response to scheduling of transactions for memory device 1140, memory controller 1120 can issue commands via I/O 1122 to cause memory device 1140 to execute the commands. In one example, controller 1150 of memory device 1140 receives and decodes command and address information received via I/O 1142 from memory controller 1120. Based on the received command and address information, controller 1150 can control the timing of operations of the logic and circuitry within memory device 1140 to execute the commands. Controller 1150 is responsible for compliance with standards or specifications within memory device 1140, such as timing and signaling requirements. Memory controller 1120 can implement compliance with standards or specifications by access scheduling and control.

Memory controller 1120 includes scheduler 1130, which represents logic or circuitry to generate and order transactions to send to memory device 1140. From one perspective, the primary function of memory controller 1120 could be said to schedule memory access and other transactions to memory device 1140. Such scheduling can include generating the transactions themselves to implement the requests for data by processor 1110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 1120 typically includes logic such as scheduler 1130 to allow selection and ordering of transactions to improve performance of system 1100. Thus, memory controller 1120 can select which of the outstanding transactions should be sent to memory device 1140 in which order, which is typically achieved with logic much more complex that a simple first-in first-out algorithm. Memory controller 1120 manages the transmission of the transactions to memory device 1140, and manages the timing associated with the transaction. In one example, transactions have deterministic timing, which can be managed by memory controller 1120 and used in determining how to schedule the transactions with scheduler 1130.

In one example, memory controller 1120 includes refresh (REF) logic 1126. Refresh logic 1126 can be used for memory resources that are volatile and need to be refreshed to retain a deterministic state. In one example, refresh logic 1126 indicates a location for refresh, and a type of refresh to perform. Refresh logic 1126 can trigger self-refresh within memory device 1140, or execute external refreshes which can be referred to as auto refresh commands) by sending refresh commands, or a combination. In one example, controller 1150 within memory device 1140 includes refresh logic 1154 to apply refresh within memory device 1140. In one example, refresh logic 1154 generates internal operations to perform refresh in accordance with an external refresh received from memory controller 1120. Refresh logic 1154 can determine if a refresh is directed to memory device 1140, and what memory resources 1160 to refresh in response to the command.

In the foregoing description examples were presented along with accompanying drawings to illustrate the various embodiments of reducing program latency with dynamic program caching. The description and drawings are illustrative of the various embodiments and are not to be construed as limiting. Numerous specific details were described to provide a thorough understanding of the various embodiments. However, in certain instances, well-known or conventional details were not described in order to provide a concise discussion.

It should be noted that, although the presented examples with accompanying drawings illustrated embodiments of dynamic program caching in the context of a TLC NAND having three pages of data, embodiments of dynamic program caching can be implemented in higher density NAND, such as QLC and PLC NAND. In addition, although the presented examples with accompanying drawings illustrated embodiments of dynamic program caching in the context of a one-pass programming algorithm to program a TLC NAND, embodiments of dynamic program caching can be implemented for other types of programming algorithms, including multi-pass programming algorithms.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Flow diagrams or process diagrams, such as FIGS. 4A-4B, provided examples of sequences of various processes. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium includes a non-transitory machine readable storage medium, and can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Additional example implementations are as follows:

Example 1 is a method, system, apparatus or computer-readable medium for an integrated circuit comprising a controller to reduce a latency of a program operation to program a multi-level cell (MLC) memory at multiple threshold voltage levels, including to issue an operation to load a first page of at least three pages to the MLC memory, the first page having data to program at a first level (L1) threshold voltage of the multiple threshold voltage levels, and issue one or more portions of the program operation to execute, at least in part, concurrently with operations issued to load one or more next pages of the at least three pages to the MLC memory, the one or more next pages having no data to program at L1.

Example 2 is the method, system, apparatus or computer-readable medium of Example 1 further comprising a page/level encoding of any of a presence of data at L1 and an absence of data at L1 for each page to be programmed to the MLC memory, and wherein the controller is to reduce the latency of the program operation responsive to a determination that the program operation can be initiated without loading all of the at least three pages to the MLC memory based on the page/level encoding, including the determination of the presence of data at L1 in the first page and the absence of data at L1 in the one or more next pages of data.

Example 3 is the method, system, apparatus or computer-readable medium of any of Examples 1 and 2 wherein the presence of data is encoded with a program bit value "0" and the absence of data is encoded with an erasure bit value "1".

Example 4 is the method, system, apparatus or computer-readable medium of any of Examples 1, 2 and 3, wherein the one or more portions of the program operation concurrently executed include a prologue operation to warm-up pumps for the program operation, including to perform logic calculations for any of a voltage and a timing of pulse-verify loops for each of the multiple threshold voltage levels at which the MLC memory is programmed, a pulse-verify loop for the L1 threshold voltage and an epilogue operation.

Example 5 is the method, system, apparatus or computer-readable medium of any of Examples 1, 2, 3 and 4 wherein to reduce the latency of the program operation to program the MLC memory, the controller monitors completion times of the operations to load the one or more next pages to the MLC memory and, based on the completion times, copies the one or more next pages loaded to the MLC memory from a cache register to a data register and resumes the program operation if a shutdown occurs.

Example 6 is the method, system, apparatus or computer-readable medium of any of Examples 1, 2, 3, 4 and 5, further comprising a dynamic program cache mode that is one of active and inactive, wherein the controller reduces the latency of the program operation responsive to a determination that the dynamic program cache mode is active.

Example 7 is the method, system, apparatus or computer-readable medium of any of Examples 1, 2, 3, 4, 5 and 6, wherein the MLC memory is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell, and further wherein the at least three pages of the MLC memory include any one of a lower ("LP"), upper ("UP"), extra ("XP") of the TLC NAND, and a lower ("LP"), upper ("UP"), extra ("XP") and top ("TP") page of the QLC NAND.

Example 8 is a method, system, apparatus or computer-readable medium for an integrated circuit for a multi-level cell (MLC) memory comprising at least three pages of memory in a memory array, and circuitry to program the at least three pages of memory at multiple threshold voltage levels, including to execute an operation to load a first page of the at least three pages, the first page having data to program at a first level (L1) of the multiple threshold voltage levels, execute one or more portions of a program operation in parallel, at least in part, with operations to load remaining pages of the at least three pages, the remaining pages having no data to program at L1, and wherein to execute the one or more portions of the program operation in parallel with the operations to load the remaining pages reduces a latency of the program operation.

Example 9 is a method, system, apparatus or computer-readable medium for an integrated circuit comprising circuitry coupled to a multi-level cell (MLC) memory having at least three pages, the circuitry to reduce a latency of a program operation to program the at least three pages at multiple threshold voltage levels, including to issue an operation to load a first page to the MLC memory, the first page having data to program at a first level (L1) of the multiple threshold voltage levels, and issue one or more portions of the program operation to execute, at least in part, concurrently with operations issued to load one or more remaining pages to the MLC memory, the one or more remaining pages having no data to program at L1.

Example 10 is a method, system, apparatus or computer-readable medium for an integrated circuit comprising a processor to any of enable and disable a dynamic program cache mode of a NAND device using a trim operation, a memory controller coupled to the NAND device, the memory controller to monitor the dynamic program cache mode, and a controller coupled to the NAND device, the controller to reduce a latency of a program operation to program at least three pages to the NAND device if the dynamic program cache mode is enabled, including to issue an operation to load a first page of at least three pages, the first page having data to program at a first level (L1) of multiple threshold voltage levels at which the at least three pages are programmed to the NAND device and issue one or more portions of the program operation to execute, at least in part, concurrently with operations issued to load one or more next pages of the at least three pages to the NAND device, the one or more next pages having no data to program at L1.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. An apparatus comprising:
   a dynamic program cache mode that is any one of active and inactive;
   a controller to reduce a latency of a program operation responsive to a determination that the dynamic program cache mode is active, the program operation to program one or more pages of at least three pages in a multi-level cell (MLC) memory at multiple threshold voltage levels, including to, for each threshold voltage level of the multiple threshold voltage levels:
   determine a presence of page data in a first page to program in the MLC memory,
   determine an absence of page data in a next page to program in the MLC memory, issue a data I/O (input/output) operation to load the first page determined as having data to program at a threshold voltage level of the multiple threshold voltage levels, and
   issue one or more portions of the program operation to execute, at least in part, concurrently with one or more data I/O operations issued to load one or more next pages determined as having no data to program at the threshold voltage level.

2. The apparatus of claim 1, further comprising:
   a page/level encoding at each level of the multiple threshold voltage levels, the page/level encoding indicating any of the presence of page data at each threshold voltage level and the absence of page data at each threshold voltage level, for each page to be programmed to the MLC memory; and
   the controller to reduce the latency of the program operation responsive to a determination that the program operation can be initiated without loading all pages to the MLC memory based on the page/level encoding, including the determination of:
   one or more pages having data to program at the threshold voltage level based on the page/level encoding indicating the presence of page data, and
   one or more next pages having no data to program at the threshold voltage level based on the page/level encoding indicating the absence of page data.

3. The apparatus of claim 2, wherein the presence of page data is encoded in the page/level encoding with a program bit value "0" and the absence of page data is encoded in the page/level encoding with an erasure bit value "1".

4. The apparatus of claim 2, wherein the one or more portions of the program operation concurrently executed include:
   a prologue operation for the program operation, including to perform logic calculations for any of a voltage and a timing of pulse-verify loops for each of the multiple threshold voltage levels at which the MLC memory is programmed;
   a pulse-verify loop for the threshold voltage level at which the MLC memory is programmed; and
   an epilogue operation.

5. The apparatus of claim 1, wherein to reduce the latency of the program operation to program the MLC memory, the controller further to:
   monitor completion times of the data I/O operations to load the one or more next pages to the MLC memory;
   based on the completion times of the data I/O operations, copy the one or more next pages loaded to the MLC memory from a cache register to a data register; and
   resume the program operation if the program operation entered a shutdown.

6. The apparatus of claim 1, wherein:
   the MLC memory is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell;
   the at least three pages of the MLC memory include any one of:
   a lower ("LP"), upper ("UP"), extra ("XP") of the TLC NAND, and
   a lower ("LP"), upper ("UP"), extra ("XP") and top ("TP") page of the QLC NAND; and
   the multi-level cells are programmable at any of eight (L0-L7), sixteen (L0-L15) and greater multiple threshold voltage levels used to represent bits of data in the at least three pages of the MLC memory.

7. A multi-level cell (MLC) memory comprising:
   at least three pages of memory in a memory array; and
   circuitry to program the at least three pages of memory at multiple threshold voltage levels in accordance with a dynamic program cache mode that is any one of enabled and disabled, including to:
   determine that a dynamic program cache mode of operation is enabled,
   execute a data I/O (input/output) operation to load a first page of the at least three pages, the first page determined as having data to program at a threshold voltage level of the multiple threshold voltage levels,
   execute one or more portions of a program operation in parallel, at least in part, with one or more data I/O operations to load remaining pages of the at least three pages, the remaining pages determined as having no data to program at the threshold voltage level, and
   wherein to execute the one or more portions of the program operation in parallel with the one or more data I/O operations to load the remaining pages reduces a latency of the program operation.

8. The MLC memory of claim 7, wherein a presence of data in the first page at the threshold voltage level and an absence of data in the remaining pages at the threshold voltage level having been determined based on a page/level encoding, wherein the presence of data is encoded in the page/level encoding with a program bit value "0" and the absence of data is encoded in the page/level encoding with an erasure bit value "1".

9. The MLC memory of claim 7, wherein to execute the one or more portions of the program operation in parallel, at least in part, with the one or more data I/O operations to load the remaining pages, the circuitry is further to:
   monitor execution completion times of the one or more data I/O operations to load the remaining pages; and
   based on the execution completion times:
   copy one or more of the remaining pages from a cache register to a data register, and
   resume the program operation if the program operation entered a shutdown occurs.

10. The MLC memory of claim 7, wherein the one or more portions of the program operation executed in parallel, at least in part, with the one or more data I/O operations to load the remaining pages include:
    a prologue operation for the program operation, including to perform logic calculations for any of a voltage and a timing during one or more pulse-verify loops for each of the multiple threshold voltage levels at which the MLC memory is programmed; and a pulse-verify loop for threshold voltage level at which the MLC memory is programmed; and an epilogue operation.

11. The MLC memory of claim 7, wherein the at least three pages of memory in the memory array comprises:

a NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell;

a lower ("LP"), upper ("UP"), extra ("XP") of the TLC NAND;

a lower ("LP"), upper ("UP"), extra ("XP") and top ("TP") page of the QLC NAND; and the multi-level cells are programmable at any of eight (L0-L7), sixteen (L0-L15) and greater multiple threshold voltage levels used to represent bits of data in the at least three pages of the MLC memory.

12. An apparatus comprising:

a dynamic program cache mode that is any one of active and inactive;

circuitry coupled to a multi-level cell (MLC) memory having at least three pages, the circuitry to reduce a latency of a program operation responsive to a determination that the dynamic program cache mode is active, the program operation to program one or more pages of the at least three pages at multiple threshold voltage levels, including to, for each threshold voltage level of the multiple threshold voltage levels:

determine a presence of page data in a first page to program in the MLC memory, determine an absence of page data in one or more remaining pages to program in the MLC memory, issue a data I/O (input/output) operation to load the first page to the MLC memory, the first page having data to program at a threshold voltage level of the multiple threshold voltage levels, and issue one or more portions of the program operation to execute, at least in part, concurrently with one or more data I/O operations issued to load one or more remaining pages to the MLC memory, the one or more remaining pages having no data to program at the threshold voltage level.

13. The apparatus of claim 12, further comprising:

a page/level encoding at each level of the multiple threshold voltage levels, the page/level encoding indicating any of the presence of page data at each threshold voltage level and an absence of page data at each threshold voltage level, for each page to be programmed to the MLC memory; and the circuitry is further to determine the presence of page data and the absence of page data at based on the page/level encoding wherein the presence of page data is encoded with a program bit value "0" and the absence of page data is encoded with an erasure bit value "1".

14. The apparatus of claim 12, wherein to reduce the latency of the program operation to program the at least three pages at multiple threshold voltage levels, the circuitry further to:

monitor completion times of the one or more data I/O operations to load the one or more next pages to the MLC memory;

based on the completion times of the one or more data I/O operations, copy the one or more next pages loaded to the MLC memory from a cache register to a data register; and resume the program operation if the program operation entered a shutdown.

15. The apparatus of claim 12, wherein the one or more portions of the program operation to execute concurrently with, at least in part, the one or more data I/O operations issued to load the one or more remaining pages to the MLC memory include:

a prologue operation for the program operation, including to perform logic calculations for any of a voltage and a timing of pulse-verify loops for each of the multiple threshold voltage levels at which the MLC memory is programmed;

a pulse-verify loop for the threshold voltage level at which the MLC memory is programmed; and an epilogue operation.

16. The apparatus of claim 12, wherein:

the MLC memory is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell;

the at least three pages of the MLC memory include any one of:

a lower ("LP"), upper ("UP"), extra ("XP") of the TLC NAND, and a lower ("LP"), upper ("UP"), extra ("XP") and top ("TP") page of the QLC NAND; and the multi-level cells are programmable at any of eight (L0-L7), sixteen (L0-L15) and greater multiple threshold voltage levels used to represent bits of data in the at least three pages of the MLC memory.

17. A system comprising:

a processor to any of enable and disable a dynamic program cache mode of a NAND device;

a memory controller coupled to the NAND device, the memory controller to monitor the dynamic program cache mode; and a controller coupled to the NAND device, the controller to reduce a latency of a program operation to program at least three pages to the NAND device at a threshold voltage level of multiple threshold voltage levels, if the dynamic program cache mode is enabled, including to, for each threshold voltage level:

determine a presence of page data in a first page at the threshold voltage level, determine an absence of page data in a next page at the threshold voltage level, issue a data I/O (input/output) operation to load the first page determined as having data to program at the threshold voltage level of the multiple threshold voltage levels at which the at least three pages are programmed to the NAND device, and issue one or more portions of the program operation to execute, at least in part, concurrently with data I/O (input/output) operations issued to load one or more next pages determined as having no data to program at the threshold voltage level.

18. The system of claim 17, further comprising:

the controller coupled to a page/level encoding for page data at the multiple threshold voltage levels wherein a program bit value "0" encodes the presence of page data at the threshold voltage level and an erasure bit value "1" encodes the absence of page data at the threshold voltage level.

19. The system of claim 17, wherein to reduce the latency of the program operation if the dynamic program cache mode is enabled, the controller further to:
monitor completion times of the data I/O operations issued to load the one or more next pages to the NAND device;
based on the completion times, copy the one or more next pages loaded to the NAND device from a cache register to a data register; and
resume the program operation if the program operation enters a shutdown.

20. The system of claim 17, wherein the one or more portions of the program operation to execute, at least in part, concurrently with the data I/O operations issued to load the one or more next pages to the NAND device include:
a prologue operation for the program operation, including to perform logic calculations for any of a voltage and a timing of pulse-verify loops for each of the multiple threshold voltage levels at which the at least three pages are programmed to the NAND device;
a pulse-verify loop for the threshold voltage level at which the NAND device is programmed; and
an epilogue operation.

21. The system of claim 17, wherein:
the NAND device is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell;
the at least three pages programmed to the NAND device include any one of:
a lower ("LP"), upper ("UP"), extra ("XP") of the TLC NAND, and
a lower ("LP"), upper ("UP"), extra ("XP") and top ("TP") page of the QLC NAND; and
the multi-level cells are programmable at any of eight (L0-L7), sixteen (L0-L15) and greater multiple threshold voltage levels used to represent bits of data in the at least three pages of the NAND device.

* * * * *